US012787157B2

(12) United States Patent
Lee et al.

(10) Patent No.: US 12,787,157 B2
(45) Date of Patent: Nov. 3, 2026

(54) CIRCUIT BOARD

(71) Applicant: Samsung Electro-Mechanics Co., Ltd., Suwon-si (KR)

(72) Inventors: Ho-Jae Lee, Suwon-si (KR); Bongbu Jung, Suwon-si (KR); Yeook Jeon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 223 days.

(21) Appl. No.: 18/667,629

(22) Filed: May 17, 2024

(65) Prior Publication Data

US 2025/0056713 A1 Feb. 13, 2025

(30) Foreign Application Priority Data

Aug. 7, 2023 (KR) ........................ 10-2023-0102973

(51) Int. Cl.
*H05K 1/02* (2006.01)
*H05K 1/03* (2006.01)
*H05K 1/11* (2006.01)

(52) U.S. Cl.
CPC ......... *H05K 1/0271* (2013.01); *H05K 1/0313* (2013.01); *H05K 1/113* (2013.01); *H05K 2201/10287* (2013.01); *H05K 2201/10977* (2013.01)

(58) Field of Classification Search
CPC .... H05K 1/0209; H05K 1/0271; H05K 1/113; H05K 1/0313
See application file for complete search history.

(56) References Cited

U.S. PATENT DOCUMENTS

2009/0095518 A1 4/2009 Matsushita et al.
2009/0134530 A1 5/2009 Kurihara et al.
2017/0352628 A1 12/2017 Furuichi et al.
2018/0027646 A1 * 1/2018 Sumida ................ H05K 1/0204 361/720
2021/0021744 A1 1/2021 Kim et al.

FOREIGN PATENT DOCUMENTS

JP 2009-239223 A 10/2009
JP 6594264 B2 10/2019
JP 6796791 B2 11/2020
KR 10-2009-0035452 A 4/2009
KR 10-2009-0052814 A 5/2009
KR 10-2023-0017334 A 2/2023

OTHER PUBLICATIONS

Korean Office Action Issued on Dec. 8, 2025, in Counterpart Korean Patent Application No. 10-2023-0102973 (1 Page in English, 2 Pages in Korean).
Korean Office Action Issued on Apr. 9, 2025, in Counterpart Korean Patent Application No. 10-2023-0102973 (7 Pages in English, 7 Pages in Korean).

* cited by examiner

*Primary Examiner* — Jeremy C Norris
(74) *Attorney, Agent, or Firm* — NSIP Law

(57) ABSTRACT

A circuit board is provided. The circuit board includes a substrate portion including at least one circuit wire, an adhesive layer disposed on a first side of the substrate portion, and a metal reinforcing layer disposed opposite to the substrate portion with respect to the adhesive layer, wherein the metal reinforcing layer includes a first surface which has a convex portion, and a second surface disposed opposite to the first surface.

15 Claims, 10 Drawing Sheets

CIRCUIT BOARD

CROSS-REFERENCE TO RELATED APPLICATIONS

This application claims the benefit under 35 USC § 119 (a) of Korean Patent Application No. 10-2023-0102973 filed on Aug. 7, 2023, in the Korean Intellectual Property Office the entire disclosure of which is incorporated herein by reference for all purposes.

BACKGROUND

1. Field

The following description relates to a circuit board.

2. Description of Related Art

In view of advancements in the electronic industry, electronic devices in the information technology (IT) field, including cameras and mobile phones, have a thin form factor, and circuit boards are thus desired to be simultaneously miniaturized, thin, and of high-density.

A circuit board forms a circuit pattern with a conductive material such as copper on an insulating material, and as electronic devices in the IT field, including cameras and mobile phones, are downsized, methods of manufacturing various ultra-thin circuit boards have been proposed, an example of which may be forming a cavity on the circuit board, and mounting electronic components such as integrated circuits (ICs), active elements, or passive elements in the cavity.

Such an ultra-thin circuit board may reduce the rigidity of the circuit board, which may intensify the warpage problem, and warpage generated on the circuit board may cause performance degradation of electronic devices used.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a circuit board includes a substrate portion comprising at least one circuit wire; an adhesive layer disposed on a first side of the substrate portion; and a metal reinforcing layer disposed opposite to the substrate portion with respect to the adhesive layer, wherein the metal reinforcing layer comprises a first surface which has a convex portion, and a second surface disposed opposite to the first surface.

The second surface of the metal reinforcing layer may have a recess portion.

A position of the convex portion of the first surface of the metal reinforcing layer and a position of the recess portion of the second surface of the metal reinforcing layer may correspond to each other.

The convex portion may be disposed in a quantity of at least two.

The first surface of the metal reinforcing layer may contact a first surface of the adhesive layer.

The first surface of the adhesive layer may have a recess portion that corresponds to the convex portion of the first surface of the metal reinforcing layer.

The convex portion of the metal reinforcing layer may have a dome shape.

The convex portion of the metal reinforcing layer may have a rectangular pillar shape.

The substrate portion may include a first protective layer disposed on a first surface of the adhesive layer; a first connection pad disposed in the first protective layer; a first insulation layer disposed on the first protective layer; and a first circuit wire disposed in the first insulation layer.

The substrate portion further may include a first via layer disposed in the first insulation layer and connected to the first circuit wire.

The substrate portion may further include a cavity, and at least a portion of the cavity is disposed in the first insulation layer.

The cavity may extend to the first protective layer.

The substrate may include a core layer disposed opposite to the metal reinforcing layer with respect to the adhesive layer; a first insulation layer disposed between the adhesive layer and the core layer; a second insulation layer disposed opposite to the first insulation layer with respect to the core layer; a first circuit wire disposed in the first insulation layer; and a second circuit wire disposed in the second insulation layer.

The substrate portion may further include a first connection pad disposed opposite to the core layer with respect to the first insulation layer, and disposed on a surface of the first insulation layer; and a second connection pad disposed opposite to the core layer with respect to the second insulation layer, and disposed on a surface of the second insulation layer.

The substrate portion may further include a first via layer disposed in the first insulation layer; and a second via layer disposed in the second insulation layer.

The substrate portion may further include a first protective layer disposed opposite to the core layer with respect to the first insulation layer, and disposed to embed at least a portion of the first connection pad; and a second protective layer disposed opposite to the core layer with respect to the second insulation layer, and disposed to embed at least a portion of the second connection pad.

Other features and aspects will be apparent from the following detailed description, the drawings, and the claims.

Figure 1:
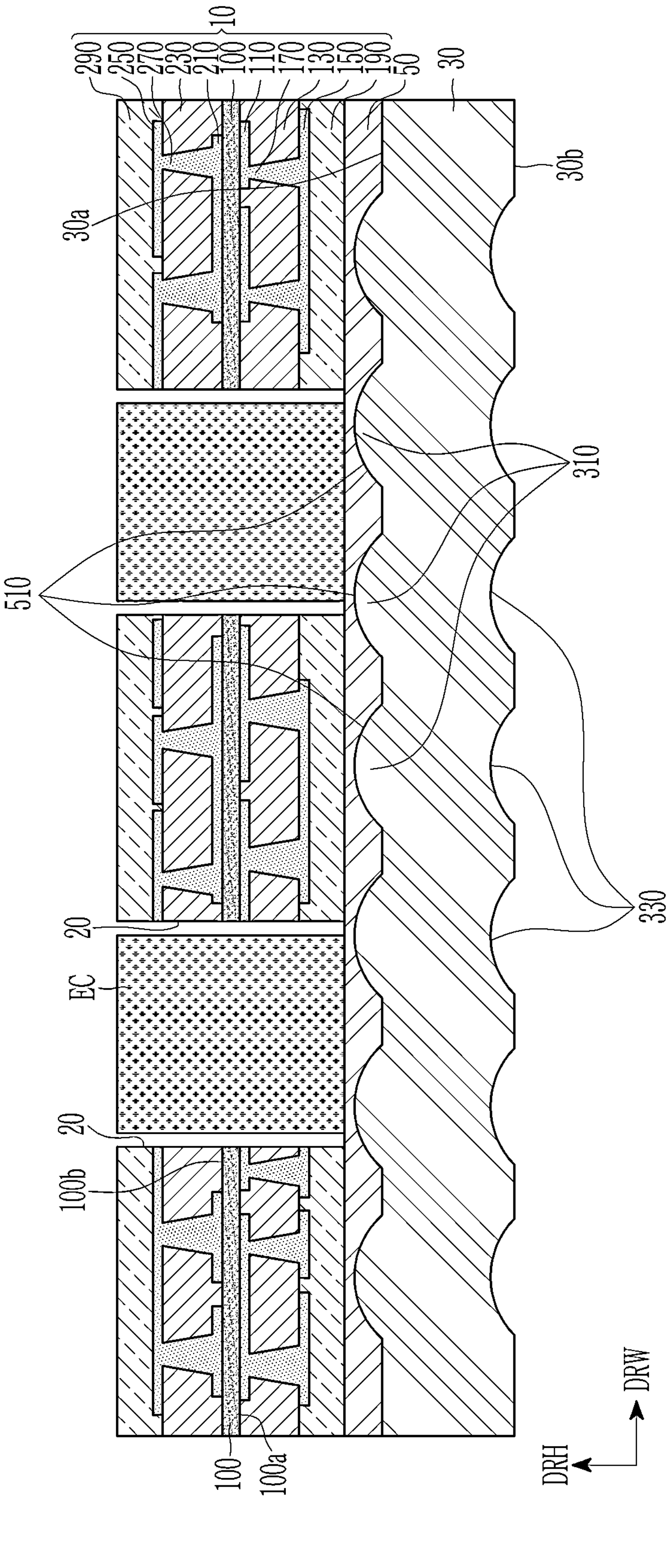
FIG. 1 illustrates a cross-sectional view of an example circuit, in accordance with one or more embodiments.

Throughout the drawings and the detailed description, unless otherwise described, the same reference numerals refer to the same elements. The drawings may not be to scale, and the relative size, proportions, and depiction of elements in the drawings may be exaggerated for clarity, illustration, and convenience.

DETAILED DESCRIPTION

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

Further, throughout the specification, the phrase "in a plan view" means when an object portion is viewed from above, and the phrase "in a cross-sectional view" means when a cross-section taken by vertically cutting an object portion is viewed from the side.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Throughout the specification, the substrate may have a structure that is wide in a plan view and thin in a cross-sectional view, 'the planar direction of the substrate' may indicate a direction parallel to the wide and flat surface of the substrate, and the 'thickness direction of the substrate' may indicate a direction that is perpendicular to a wide and flat surface of the substrate.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

One or more examples may provide a circuit board that improves the warpage of a circuit board while maintaining the thickness of the circuit board.

According to a circuit board according to one or more examples, a convex portion is formed in a metal reinforcing layer to increase bending rigidity, a circuit board having improved warpage, even if the thickness is thin, may be provided.

FIG. 1 illustrates a cross-sectional view of an example circuit board, in accordance with one or more embodiments.

Referring to FIG. 1, a circuit board, in accordance with one or more embodiments, may include a substrate portion 10, a cavity 20 positioned in the substrate portion 10, a metal reinforcing layer 30 positioned below the substrate portion 10, and an adhesive layer 50 interposed between the substrate portion 10 and the metal reinforcing layer 30.

In an example, the substrate portion 10 may be a printed circuit board or a flexible printed circuit board. The substrate portion 10 may include a core layer 100, a first insulation layer 130 positioned below the core layer 100, a first circuit wire 110 positioned in the first insulation layer 130, a first via layer 170 positioned in the first insulation layer 130, a first connection pad 150 positioned below the first insulation layer 130, a second insulation layer 230 positioned above the core layer 100, a second circuit wire 210 positioned on the second insulation layer 230, a second via layer 270 positioned in the second insulation layer 230, and a second connection pad 250 positioned above the second insulation layer 230.

The core layer 100 may have a predetermined area and thickness. The core layer 100 may have a first surface 100*a* and a second surface 100*b* formed opposite to each other. The core layer 100 may have a structure that is wide in a plan view and thin in a cross sectional view. A direction perpendicular to the first surface 100*a* or the second surface 100*b* may mean a direction perpendicular to the wide and flat surface of the core layer 100.

The core layer 100 may include a thermosetting resin such as, but not limited to, epoxy resin, polyimide, or the like, or a thermoplastic resin such as polyethylene (PE), polycarbonate (PC), or polyvinyl chloride (PVC), and may further include a resin containing a reinforcing material such as glass fiber or inorganic filler, or the like. For example, the core layer 100 may include pre-preg, ABF (Ajinomoto Buildup Film), photo imageable dielectric (PID), BT (Bismaleimide Triazine) resin, and the like.

The first circuit wire 110 may be positioned below the first surface 100*a* of the core layer 100. The first circuit wire 110 may transfer electrical signals. The first circuit wire 110 may be disposed in various patterns. The first circuit wire 110 may include, as only examples, a conductive material such as, but not limited to, copper (Cu), aluminum (Al), silver (Ag), tin (Sn), gold (Au), nickel (Ni), lead (Pb), titanium (Ti), or an alloy thereof.

FIG. 1 illustrates that the first circuit wire 110 is configured in a single wire layer disposed on the first surface 100*a*. However, the examples are not limited thereto. The first circuit wire 110 may be a multi-layered wire layer that is stacked downward, and may include the wire layer positioned on the first surface 100*a*, which also falls within the scope of the one or more examples. Multi-layered wire layers may be connected to each other through a via layer.

The first insulation layer 130 may be positioned below the first surface 100*a* of the core layer 100. The first circuit wire 110 may be embedded in the first insulation layer 130. The first insulation layer 130 may include a thermosetting resin such as, but not limited to, an epoxy resin, a polyimide, or the like, a thermoplastic resin such as polyethylene (PE), polycarbonate (PC), polyvinyl chloride (PVC), or the like. Additionally, the first insulation layer 130 may include a resin including a reinforcing material such as, but not limited to, glass fiber or an inorganic filler. In an example, the first insulation layer 130 may include pre-preg, Ajinomoto Buildup Film (ABF), photo imageable dielectric (PID), or the like, but is not limited thereto.

The first connection pad 150 may be positioned below the first insulation layer 130. That is, the first connection pad 150 may be positioned on one surface of the first insulation layer 130. A surface of the first insulation layer 130 may mean a surface that is opposite to the surface of the first insulation layer 130 that contacts the core layer 100. The first connection pad 150 may be disposed in various patterns below the first insulation layer 130. The first connection pad 150 may include a conductive material such as, but not limited to, copper (Cu), aluminum (Al), silver (Ag), tin (Sn), gold (Au), nickel (Ni), lead (Pb), titanium (Ti), or an alloy thereof.

The first via layer 170 may be positioned in the first insulation layer 130, and may connect the first circuit wire 110 and the first connection pad 150. In an example, the first via layer 170 may include copper (Cu), silver (Ag), palladium (Pd), aluminum (Al), nickel (Ni), titanium (Ti), gold (Au), platinum (Pt), or an alloy thereof, or the like. The first via layer 170 may be formed of the same material as the first circuit wiring 110.

A first protective layer 190 may be disposed below the first insulation layer 130. The first protective layer 190 may include an insulating material such as solder resist. At least a portion of the first connection pad 150 may be embedded by the first protective layer 190.

The second circuit wire 210 may be positioned above the second surface 100*b* of the core layer 100. The second circuit wire 210 may transfer electrical signals. The second circuit wire 210 may be disposed in various patterns. The second circuit wire 210 may include a conductive material such as, but not limited to, copper (Cu), aluminum (Al), silver (Ag), tin (Sn), gold (Au), nickel (Ni), lead (Pb), titanium (Ti), or an alloy thereof.

FIG. 1 illustrates that the second circuit wire 210 is configured as a single wire layer disposed on the second surface 100*b*. However, the examples are not limited thereto. The second circuit wire 210 may be a multi-layered wire layer that is stacked upward of the wire layer positioned on the second surface 100*b*, which also falls within the scope of the one or more examples. Multi-layered wire layers may be connected to each other through a via layer.

The second insulation layer 230 may be positioned above the second surface 100*b* of the core layer 100. The second circuit wire 210 may be embedded in the second insulation layer 230. The second insulation layer 230 may include a thermosetting resin such as, but not limited to, an epoxy resin, a polyimide, or the like, a thermoplastic resin such as polyethylene (PE), polycarbonate (PC), polyvinyl chloride (PVC), or the like. Additionally, the second insulation layer 230 may include a resin including a reinforcing material such as glass fiber or an inorganic filler. In an example, the second insulation layer 230 may include pre-preg, Ajinomoto Buildup Film (ABF), photo imageable dielectric (PID), or the like, but is not limited thereto. The second connection pad 250 may be positioned above the second insulation layer 230. That is, the second connection pad 250 may be positioned on one surface of the second insulation layer 230. A surface of the second insulation layer 230 may mean a surface that is opposite to the surface of the second insulation layer 230 that contacts the core layer 100. The second connection pad 250 may be disposed in various patterns above the second insulation layer 230. The second connection pad 250 may include a conductive material such as, but not limited to, copper (Cu), aluminum (Al), silver (Ag), tin (Sn), gold (Au), nickel (Ni), lead (Pb), titanium (Ti), or an alloy thereof.

The second via layer 270 may be positioned in the first insulation layer 130, and may connect the second circuit wire 210 and the second connection pad 250. For example, the second via layer 270 may include copper (Cu), silver (Ag), palladium (Pd), aluminum (Al), nickel (Ni), titanium (Ti), gold (Au), platinum (Pt), or an alloy thereof, or the like. The second via layer 270 may be formed of the same material as the second circuit wiring 210.

The first protective layer 190 may be disposed above the second insulation layer 230. The first protective layer 190 may include an insulating material such as solder resist. At least a portion of the second connection pad 250 may be embedded by a second protective layer 290.

A cavity 20 may be formed in the substrate portion 10. The cavity 20 may pass through the substrate 10 along a height direction DRH, or may be located on a part of the substrate 10. In an example, at least a portion of the cavity 20 may be positioned in the first insulation layer 130 and may extend to the first protective layer 190. As another example, the cavity 20 may be formed from the first protective layer 190 to the second protective layer 290. In FIG. 1, the width of the cavity 20 is shown to be constant, but is not limited thereto. In an example, the width of the cavity 20 may vary according to the height, that is, the width of the cavity 20 overlapping the first protective layer 190 and the width of the cavity 20 overlapping the second protective layer 290 may be different from each other. In an example, the cavity 20 may have a portion whose width gradually increases from the first protective layer 190 to the second protective layer 290. An electronic element EC mounted on the substrate portion 10 may be positioned in the cavity 20. In a non-limited example, the electronic element EC may be an integrated circuit (IC). The cavity 20 may be formed in a plural number, and may be positioned to be spaced apart from each other.

The metal reinforcing layer 30 may be disposed below the substrate portion 10. The metal reinforcing layer 30 supports the substrate 10 to prevent warpage from occurring. The metal reinforcing layer 30 may include a metallic material such as, but not limited to, copper (Cu), aluminum (Al), silver (Ag), tin (Sn), gold (Au), nickel (Ni), lead (Pb), titanium (Ti), or an alloy thereof, but is not limited thereto.

The adhesive layer 50 may be interposed between the substrate portion 10 and the metal reinforcing layer 30. That is, the metal reinforcing layer 30 may be attached to the substrate portion 10 by the adhesive layer 50. In an example, the adhesive layer 50 may include a conductive material. The adhesive layer 50 may electrically interconnect the substrate portion 10 and the metal reinforcing layer 30. At this time, the metal reinforcing layer 30 may serve as a ground layer.

Figure 2:
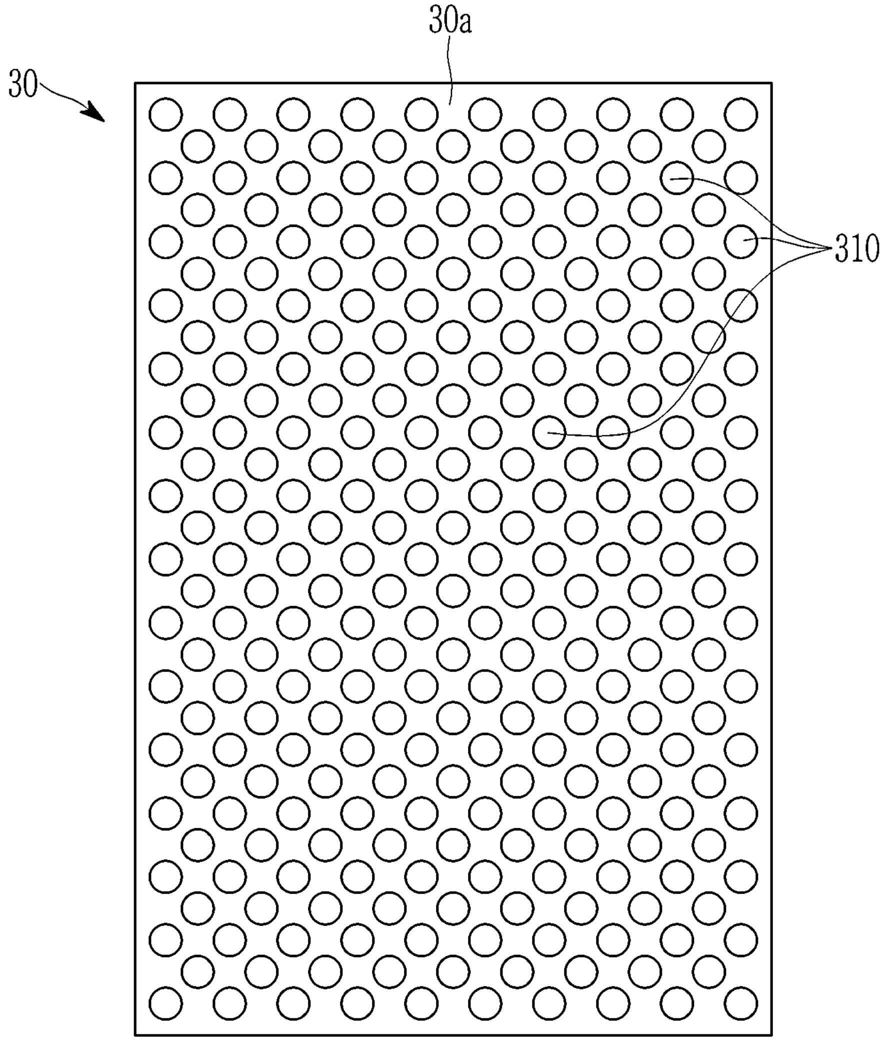
FIG. 2 illustrates a top plan view of an example metal reinforcing layer of the example circuit board shown in FIG. 1.

FIG. 2 is a top plan view illustrating a metal reinforcing layer of the circuit board shown in FIG. 1.

Referring to FIG. 1 and FIG. 2, the metal reinforcing layer 30 may have a first surface 30*a* and a second surface 30*b* facing opposite from each other. In an example, the adhesive layer 50 may be attached on the first surface 30*a*. A convex portion 310 may be formed in the first surface 30*a*. A plurality of convex portions 310 may be formed on the first surface 30*a*, and the metal reinforcing layer 30 formed with the plurality of convex portions 310 may have an embossing structure in which convex shapes protrude at regular intervals. A recess portion 330 may be formed in the second surface 30*b*. The convex portion 310 may have a dome shape. The convex portion 310 and the recess portion 330 may be formed to correspond to each other. That is, the convex portion 310 and the concave portion 330 may overlap in a plan view, and the concave portion 330 may be formed in a spherical recess shape corresponding to the dome shape of the convex portion 310. When the convex portion 310 and the recess portion 330 are formed to positionally correspond to each other, bending rigidity against the pressure applied from above increases, and therefore, the warpage may be improved even if the thickness of the metal reinforcing layer 30 is not increased. Other substrate parts may not be coupled to the second surface 30*b*.

The adhesive layer 50 may be interposed between the substrate portion 10 and the metal reinforcing layer 30 to attach the substrate portion 10 and the metal reinforcing layer 30. Additionally, when the electronic element EC is inserted into the cavity 20, the adhesive layer 50 may provide a position where the electronic element EC may be seated. Additionally, the adhesive layer 50 may fix the electronic element EC positioned in the cavity 20. A recess portion 510 may be formed on a first surface of the adhesive layer 50 that contacts the first surface 30*a* of the metal reinforcing layer 30. The concave portion 510 may have a spherical recess shape corresponding to the dome-shaped convex portion 310 formed on the first surface 30*a* of the metal reinforcing layer 30.

Figure 3:
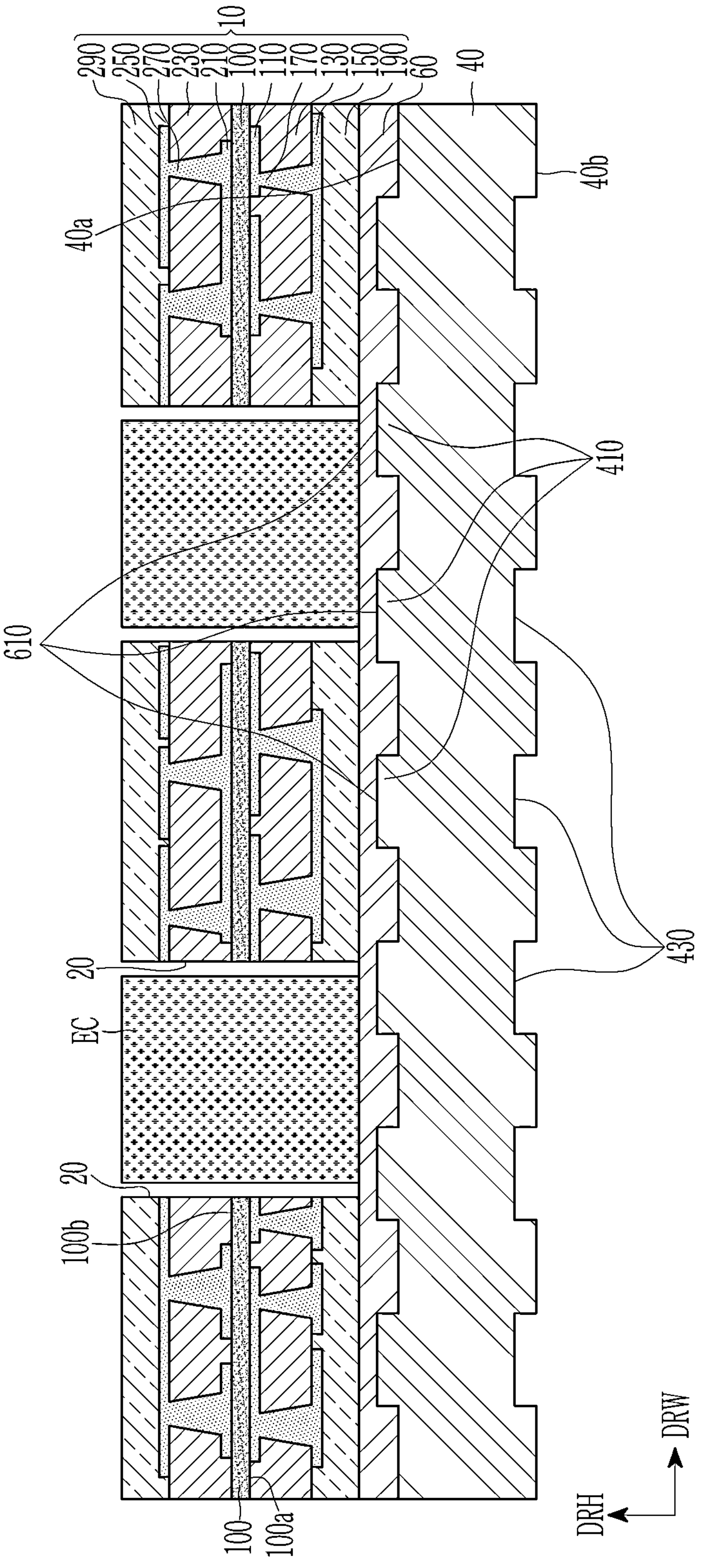
FIG. 3 illustrates a cross-sectional view of a variation of the example circuit board shown in FIG. 1.
Figure 4:
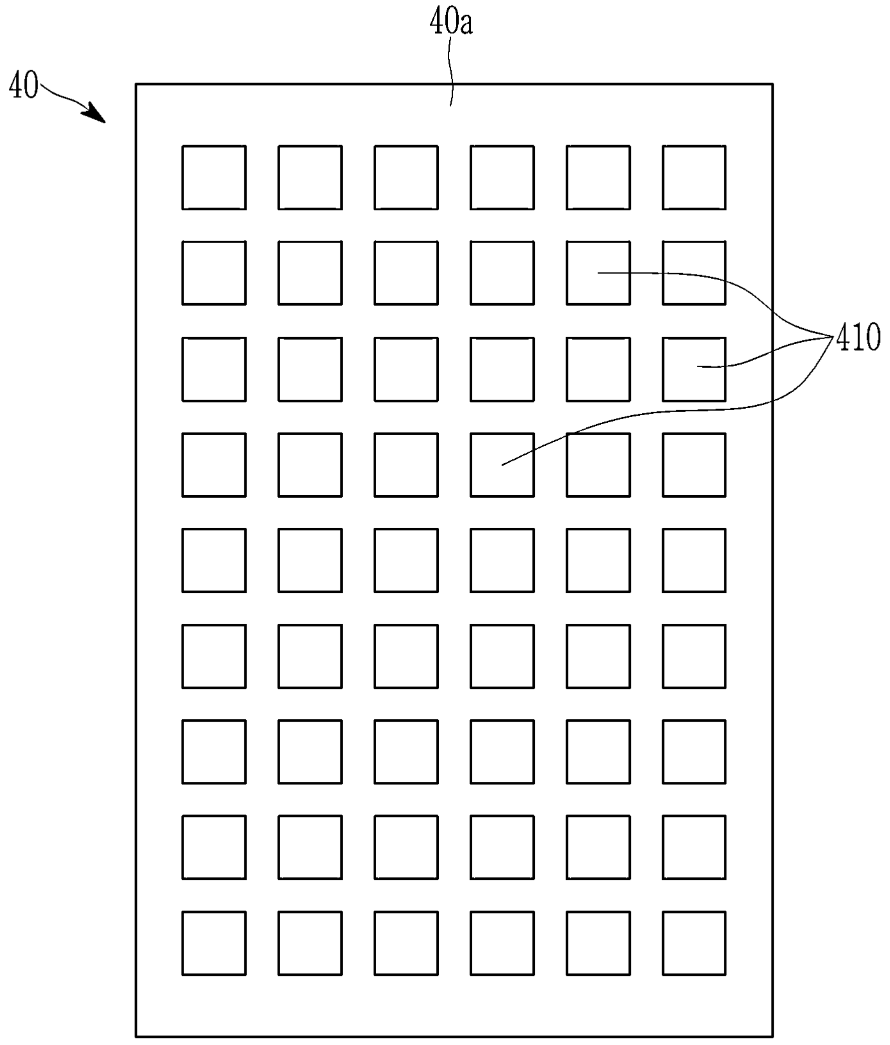
FIG. 4 illustrates a top plan view of a metal reinforcing layer of the example circuit board shown in FIG. 3.

FIG. 3 illustrates a cross-sectional view showing a variation of the circuit board illustrated in FIG. 1 and FIG. 2. FIG. 4 is a top plan view illustrating a metal reinforcing layer of the circuit board shown in FIG. 3.

The circuit board illustrated in FIG. 3 and FIG. 4 may have the same stacking structure as the circuit board shown in FIG. 1 and FIG. 2. That is, a circuit board according to an embodiment may include the substrate portion 10, the cavity 20 disposed in the substrate portion 10, an adhesive layer 60 disposed below the substrate portion 10, and a metal reinforcing layer 40 disposed below the adhesive layer 60.

Referring to FIG. 3 and FIG. 4, the metal reinforcing layer 40 of a circuit board according to an embodiment is formed on a first surface 40*a*, and may have a convex portion 410 that is of a rectangular pillar shape in a plane view. FIG. 3 illustrates that the edge of the convex portion 410 has an angled shape, but is not limited thereto, and the edge of the convex portion 410 may also have a curved shape.

A recess portion 430 may be formed on a second surface 40*b* of the metal reinforcing layer 40. In an example, a position of the recess portion 430 may be formed to correspond to a position of the convex portion 410. That is, the convex portion 410 and the recess portion 430 may overlap in a plan view, and the recess portion 430 may be formed in a rectangular recess shape corresponding to the rectangular pillar shape of the convex portion 410.

A recess portion 610 may be formed on a first surface of the adhesive layer 60 that contacts the first surface 40*a* of the metal reinforcing layer 40. The recess portion 610 may be formed in a rectangular recess shape that corresponds to the convex portion 410 of the rectangular pillar shape formed on the first surface 40*a* of the metal reinforcing layer 40.

As such, according to a circuit board of an embodiment, the respective convex portions 310 and 410 formed on the respective metal reinforcing layers 30 and 40 increase the bending rigidity of the circuit board, and therefore, the warpage may be improved while maintaining an overall thickness of the circuit board.

[Warpage Comparison Experiment]

Hereinafter, warpage comparison experiments will be described with reference to FIG. 5 to FIG. 10.

Embodiments and Comparative Example

Circuit boards of a Comparative Example, an Embodiment 1, and an Embodiment 2 in which a printed circuit board as the substrate layer and a metal plate as the metal reinforcing layer are coupled by the adhesive layer are manufactured in plural quantities.

The printed circuit board is manufactured to have an elastic modulus of 25 Gpa, a Poisson's ratio of 0.3, a coefficient of thermal expansion (CTE) of 15 ppm/° C. (when the temperature is below 200° C.) and 25 ppm/° C. (when the temperature is above 200° C.), and a dimension of 10 mm×15 mm×0.25 mm.

The metal plate is manufactured to have a elastic modulus of 110 Gpa, a Poisson's ratio of 0.3, a coefficient of thermal expansion of 11 ppm/° C., and a dimension of 10 mm×15 mm×0.15 mm.

The adhesive layer is manufactured to have a elastic modulus of 3 Gpa, a Poisson's ratio of 0.3, a coefficient of thermal expansion of 71 ppm/° C. (when the temperature is below 57° C.) and 129 ppm/° C. (when the temperature is above 57° C.) and a dimension of 10 mm×15 mm×0.25 mm.

The metal plate of Comparative Example is prepared such that both surfaces are flat (flat metal plate).

In the metal plate of Embodiment 1, a plurality of dome-shaped convex portions having a height of 0.03 mm are formed on a first surface, and the recess portion having a height of 0.03 mm are formed on a second surface to correspond to the convex portion (round pattern metal plate). The convex portion and the recess portion were formed through a process of applying pressure to the other surface.

In the metal plate of Embodiment 2, a plurality of rectangular-pillar shaped convex portions having a height of 0.03 mm are formed on a first surface, and the recess portion having a height of 0.03 mm are formed on a second surface to correspond to the convex portion (square pattern metal plate). The convex portion and the recess portion were formed through a process of applying pressure to the other surface.

Experimental Example 1: Warpage Measurement in Decreasing Temperature Condition

Figure 5:
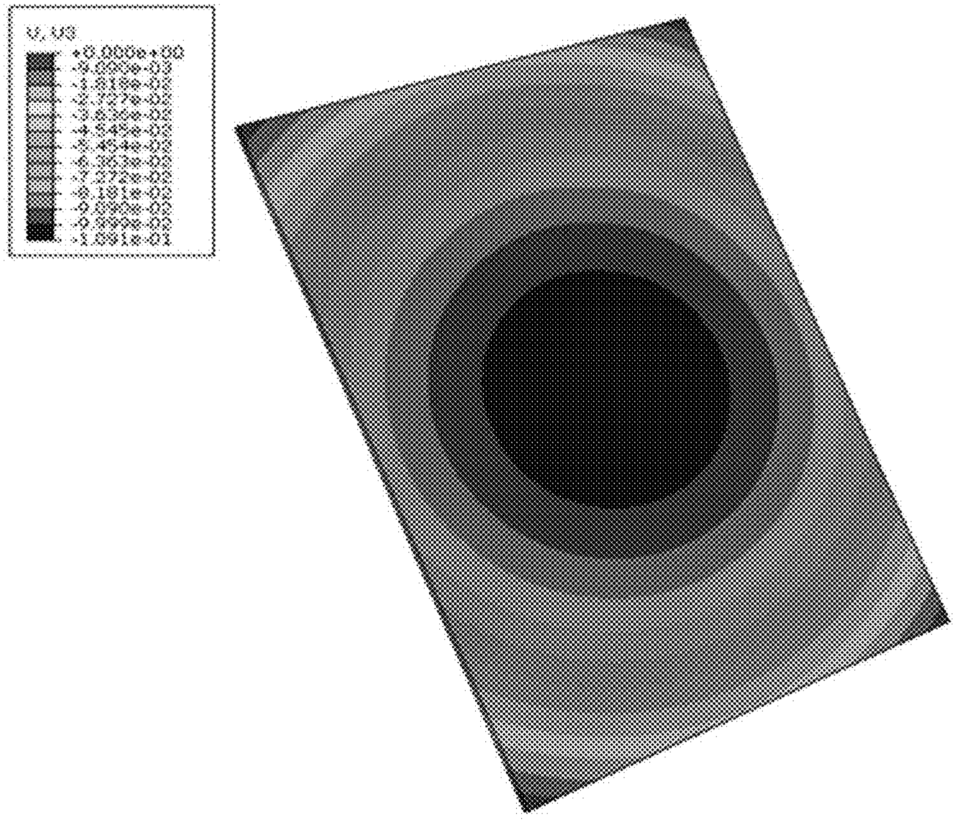
FIG. 5 illustrates results of measuring warpage generation with respect to a circuit board of a Comparative Example in a warpage comparison experiment in a decreasing temperature environment.
Figure 6:
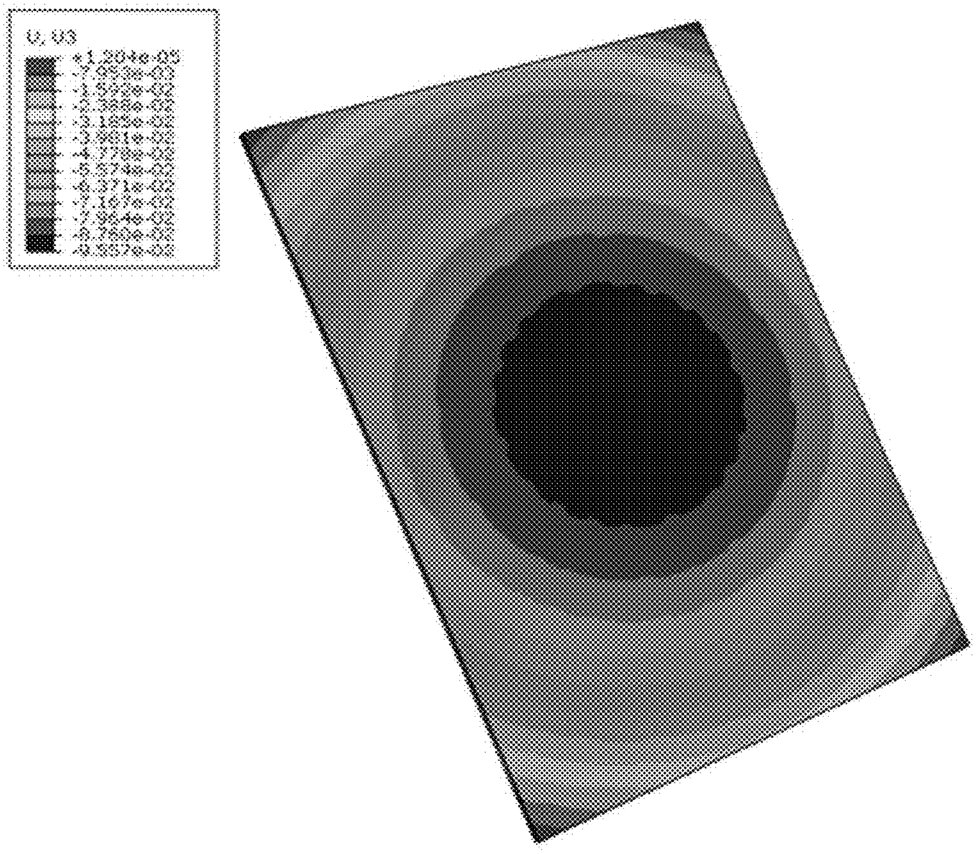
FIG. 6 illustrates results of measuring warpage generation with respect to a circuit board of an Embodiment 1 in a warpage comparison experiment in a decreasing temperature environment.
Figure 7:
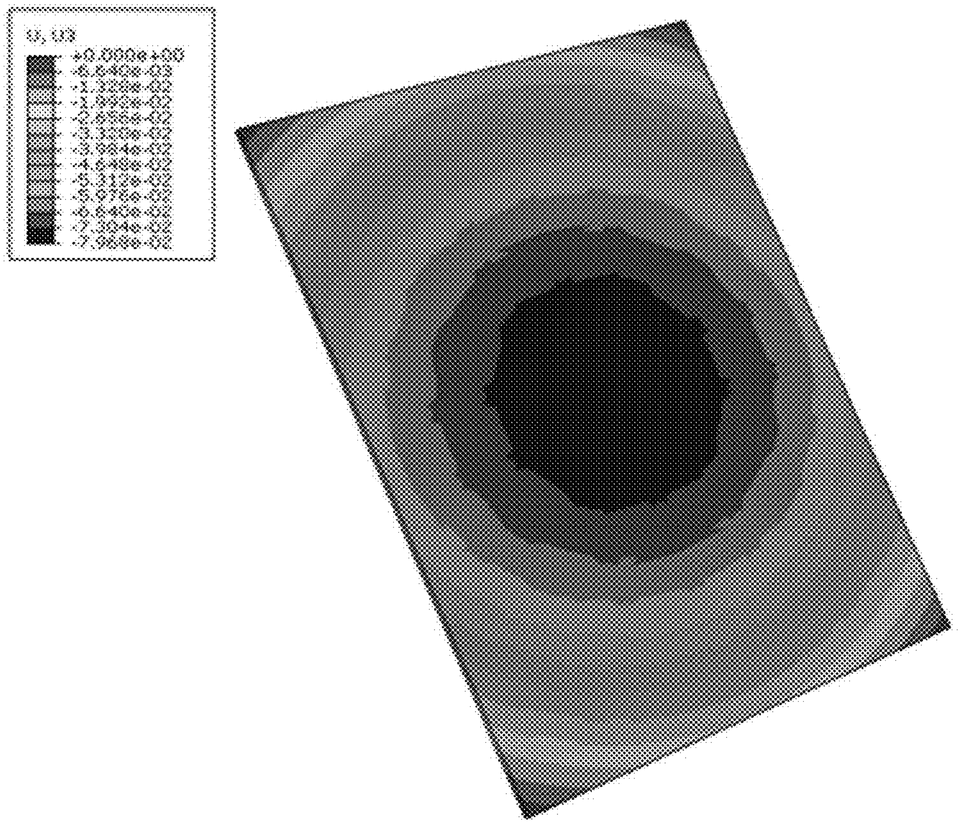
FIG. 7 illustrates results of measuring warpage generation with respect to a circuit board of an Embodiment 2 in a warpage comparison experiment in a decreasing temperature environment.

FIG. 5 to FIG. 7 are drawings showing measured results of warpage generation under decreasing temperature environment with respect to each of the circuit boards of Comparative Example, Embodiment 1, and Embodiment 2, in a warpage comparison experiment in a decreasing temperature environment.

In Experimental Example 1, while decreasing the temperature from a reference temperature 170° C. with no warpage to a room temperature 25° C., height differences from a reference height 0.00 to multiple points were measured.

TABLE 1

| Warpage measurement result in decreasing temperature environment | | | |
|---|---|---|---|
| 170° C. -> 25° C. | Comparative Example | Embodiment 1 | Embodiment 2 |
| Measured warpage | −109.1 μm | −95.5 μm | −79.6 μm |
| Warpage ratio | 1.0 | 0.875 | 0.730 |

In Table 1, the measured warpage is a value having a largest absolute value among height differences from the reference height 0.00 to the respective measured points. The warpage ratio is a relative ratio of the measured warpage of Embodiment 1 and Embodiment 2 when the measured warpage of Comparative Example is 1.0.

As shown in Table 1, the warpage of the circuit board using the flat metal plate was measured as the highest. The circuit board using the round pattern metal plate shows improved warpage better than the flat metal plate, and the square pattern metal plate showed the best warpage.

Experimental Example 2: Warpage Measurement in Increasing Temperature Condition

Figure 8:
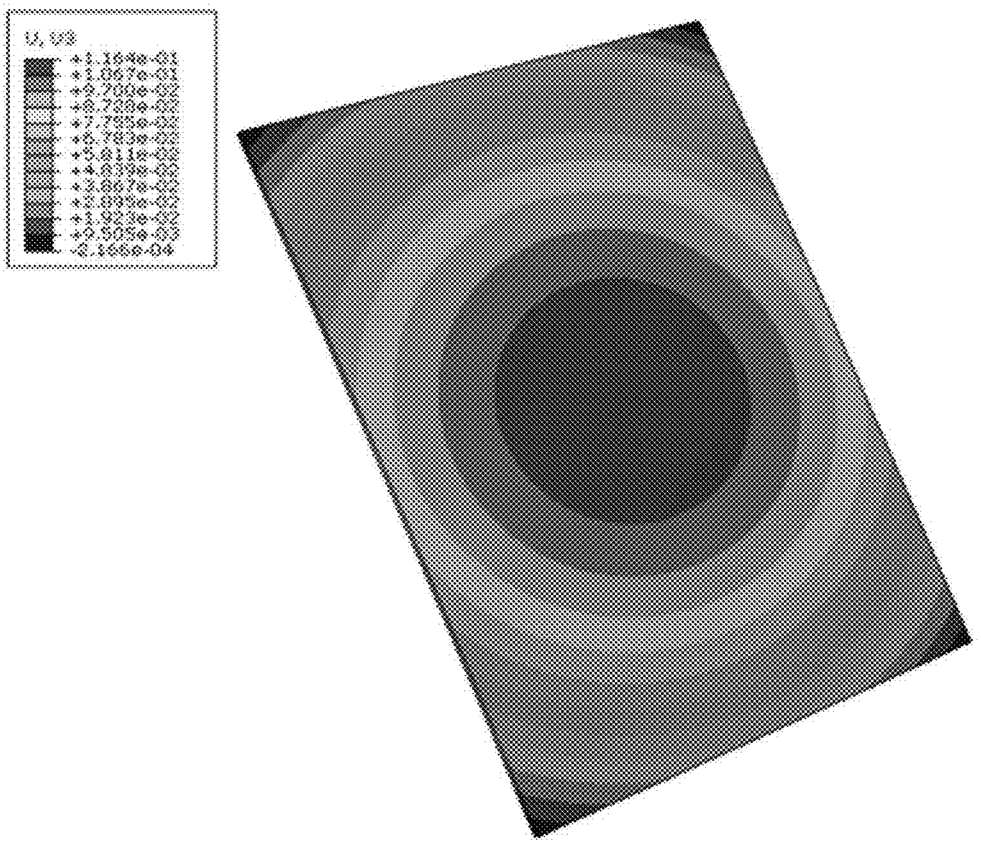
FIG. 8 illustrates results of measuring warpage generation with respect to a circuit board of a Comparative Example in a warpage comparison experiment in an increasing temperature environment.
Figure 9:
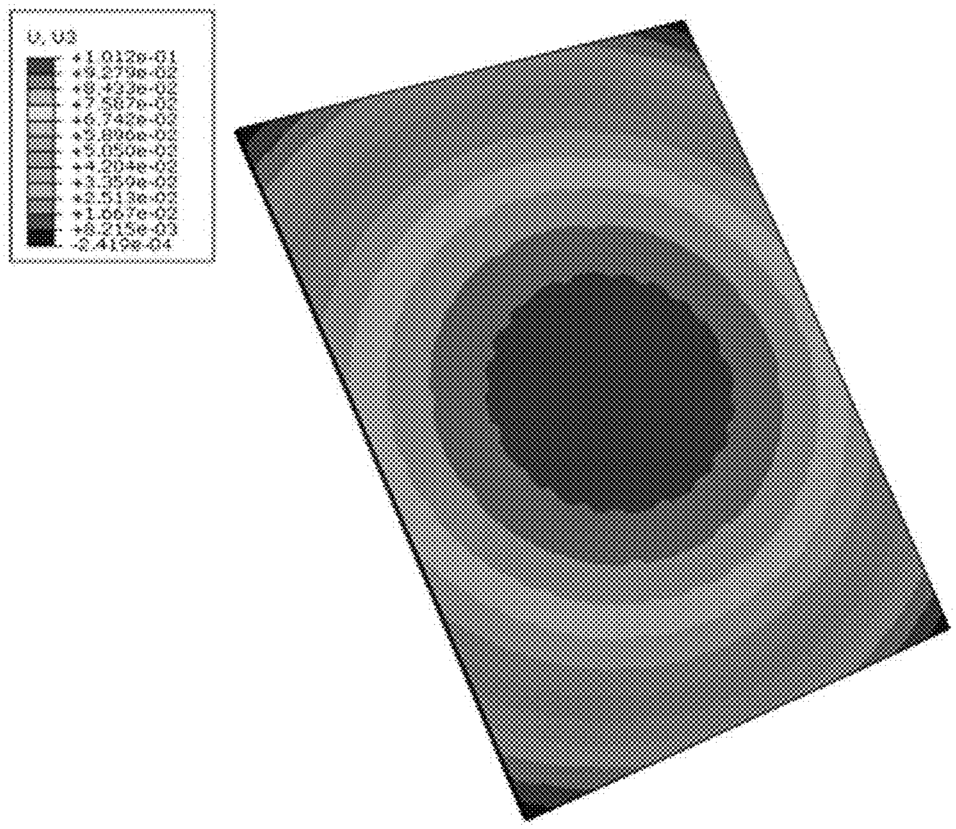
FIG. 9 illustrates results of measuring warpage generation with respect to a circuit board of an Embodiment 1 in a warpage comparison experiment in an increasing temperature environment.
Figure 10:
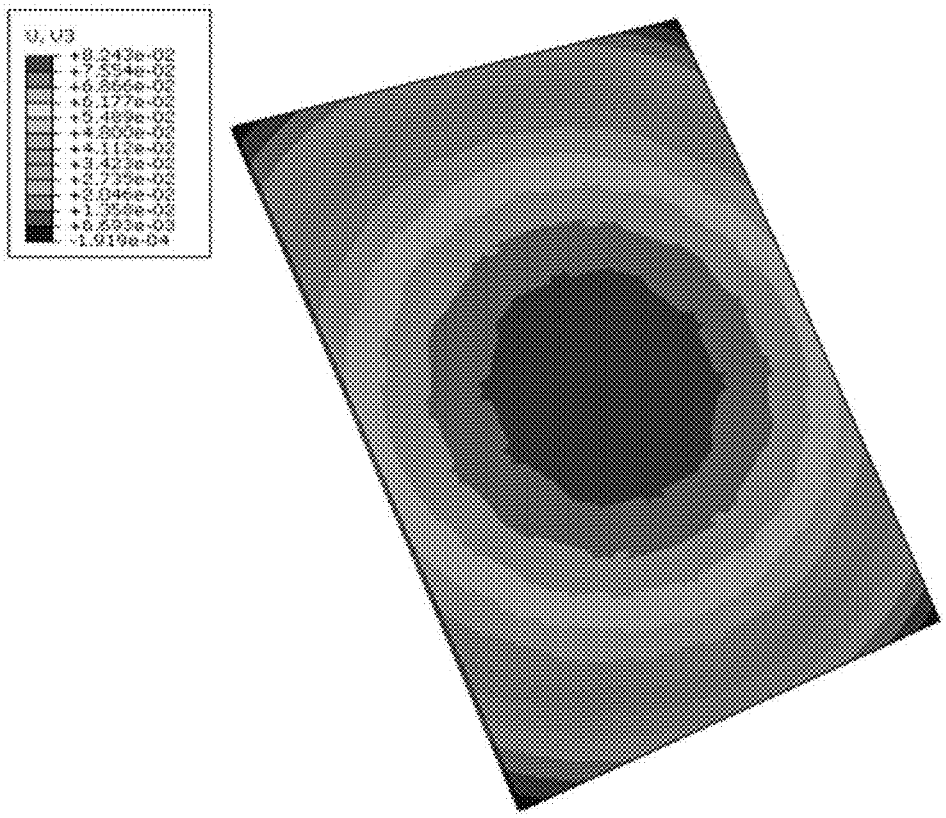
FIG. 10 illustrates results of measuring warpage generation with respect to a circuit board of an Embodiment 2 in a warpage comparison experiment in an increasing temperature environment.

FIG. 8 to FIG. 10 illustrate measured results of warpage generation with respect to each of the circuit boards of Comparative Example, Embodiment 1, and Embodiment 2 in a warpage comparison experiment in an increasing temperature environment.

In Experimental Example 2, while increasing the temperature from the reference temperature 170° C. with no warpage to a high temperature 260° C., height differences from a reference height 0.00 to multiple points were measured.

TABLE 2

| Warpage measurement result in increasing temperature environment | | | |
|---|---|---|---|
| 170° C. -> 260° C. | Comparative Example | Embodiment 1 | Embodiment 2 |
| Measured warpage | 116.4 μm | 101.2 μm | 82.4 μm |
| Warpage ratio | 1.0 | 0.869 | 0.708 |

In Table 2, the measured warpage is a value having a largest absolute value among height differences from the reference height 0.00 to the respective measured points. The warpage ratio is a relative ratio of the measured warpage of Embodiment 1 and Embodiment 2 when the measured warpage of Comparative Example is 1.0.

As shown in Table 2, the warpage of the circuit board using the flat metal plate was measured as the highest. The circuit board using the round pattern metal plate shows improved warpage better than the flat metal plate, and the square pattern metal plate showed the best warpage.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit board, comprising:

a substrate portion comprising at least one circuit wire;

an adhesive layer disposed on a first side of the substrate portion; and a metal reinforcing layer disposed opposite to the substrate portion with respect to the adhesive layer, wherein the metal reinforcing layer comprises a first surface which has a convex portion, and a second surface disposed opposite to the first surface, and wherein the first surface of the metal reinforcing layer contacts a first surface of the adhesive layer such that the convex portion is in contact with the first surface of the adhesive layer.

2. The circuit board of claim 1, wherein the second surface of the metal reinforcing layer has a recess portion.

3. The circuit board of claim 2, wherein a position of the convex portion of the first surface of the metal reinforcing layer and a position of the recess portion of the second surface of the metal reinforcing layer correspond to each other.

4. The circuit board of claim 1, wherein the convex portion is disposed in a quantity of at least two.

5. The circuit board of claim 1, wherein the first surface of the adhesive layer has a recess portion that corresponds to the convex portion of the first surface of the metal reinforcing layer.

6. The circuit board of claim 1, wherein the convex portion of the metal reinforcing layer has a dome shape.

7. The circuit board of claim 1, wherein the convex portion of the metal reinforcing layer has a rectangular pillar shape.

8. The circuit board of claim 1, wherein the substrate portion comprises:

a first protective layer disposed on a first surface of the adhesive layer;

a first connection pad disposed in the first protective layer;

a first insulation layer disposed on the first protective layer; and a first circuit wire disposed in the first insulation layer.

9. The circuit board of claim 8, wherein the substrate portion further comprises a first via layer disposed in the first insulation layer and connected to the first circuit wire.

10. The circuit board of claim 8, wherein the substrate portion further comprises a cavity, and at least a portion of the cavity is disposed in the first insulation layer.

11. The circuit board of claim 10, wherein the cavity extends to the first protective layer.

12. The circuit board of claim 1, wherein the substrate portion comprises:

a core layer disposed opposite to the metal reinforcing layer with respect to the adhesive layer;

a first insulation layer disposed between the adhesive layer and the core layer;

a second insulation layer disposed opposite to the first insulation layer with respect to the core layer;

a first circuit wire disposed in the first insulation layer; and a second circuit wire disposed in the second insulation layer.

13. The circuit board of claim 12, wherein the substrate portion further comprises:

a first connection pad disposed opposite to the core layer with respect to the first insulation layer, and disposed on a surface of the first insulation layer; and a second connection pad disposed opposite to the core layer with respect to the second insulation layer, and disposed on a surface of the second insulation layer.

14. The circuit board of claim 13, wherein the substrate portion further comprises:

a first via layer disposed in the first insulation layer; and a second via layer disposed in the second insulation layer.

15. The circuit board of claim 13, wherein the substrate portion further comprises:

a first protective layer disposed opposite to the core layer with respect to the first insulation layer, and disposed to embed at least a portion of the first connection pad; and a second protective layer disposed opposite to the core layer with respect to the second insulation layer, and disposed to embed at least a portion of the second connection pad.

* * * * *